United States Patent [19]

Krishna et al.

[11] Patent Number: 4,958,210
[45] Date of Patent: Sep. 18, 1990

[54] HIGH VOLTAGE INTEGRATED CIRCUITS

[75] Inventors: Surinder Krishna, Ballston Lake, N.Y.; Manuel L. Torreno, Jr., Richardson, Tex.; Michael S. Adler, Schenectady, N.Y.

[73] Assignee: General Electric Company, Schenectady, N.Y.

[21] Appl. No.: 440,457

[22] Filed: Nov. 20, 1989

Related U.S. Application Data

[63] Continuation of Ser. No. 514,752, Jul. 18, 1983, abandoned, which is a continuation of Ser. No. 2,378, Jan. 10, 1979, abandoned, which is a continuation of Ser. No. 870,217, Jan. 17, 1978, abandoned, which is a continuation of Ser. No. 703,095, Jul. 6, 1976, abandoned.

[51] Int. Cl.$^5$ .................... H01L 29/72; H01L 27/04; H01L 29/34; H01L 23/48
[52] U.S. Cl. ........................... 357/34; 357/48; 357/52; 357/68
[58] Field of Search ................. 357/34, 48, 52, 53, 357/68

[56] References Cited

U.S. PATENT DOCUMENTS

| | | | |
|---|---|---|---|
| 2,981,877 | 4/1961 | Noyce . | |
| 3,302,076 | 1/1967 | Kang et al. | 357/53 |
| 3,405,329 | 10/1968 | Loro et al. | 357/53 |
| 3,647,580 | 3/1972 | Weinerth | 357/20 |
| 3,751,720 | 8/1973 | Nestork | 357/68 |
| 3,796,598 | 3/1974 | Gejyo et al. | 357/71 |
| 3,836,998 | 9/1974 | Kocsis et al. | 357/68 |
| 3,885,999 | 5/1975 | Fusaroli et al. | 357/20 |
| 4,006,492 | 2/1977 | Eichelberger et al. | 357/68 |

OTHER PUBLICATIONS

Sze, *Physics of Semiconductor Devices*, Wiley, N.Y. (1969), pp. 111–117, 481–485.

*Primary Examiner*—Gene M. Munson
*Attorney, Agent, or Firm*—Marvin Snyder; James C. Davis, Jr.

[57] ABSTRACT

Premature avalanche breakdown resulting from high electric fields produced by metal interconnections crossing underlying high conductivity regions of an integrated circuit is eliminated by selectively providing discontinuities in the high conductivity regions underlying the metal interconnection paths.

10 Claims, 2 Drawing Sheets

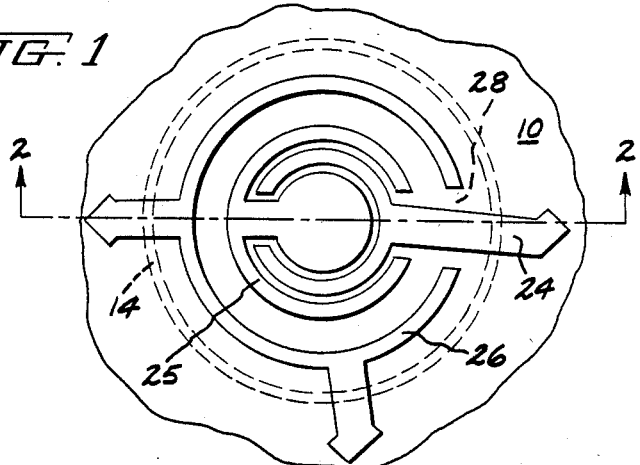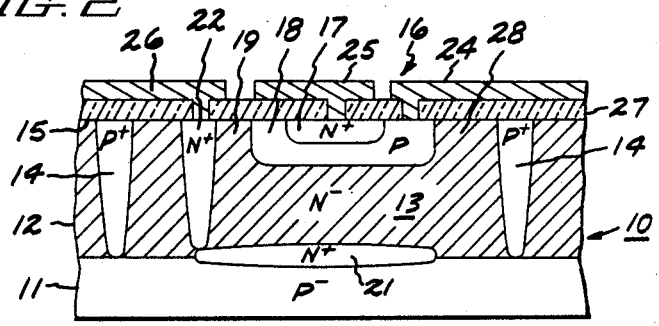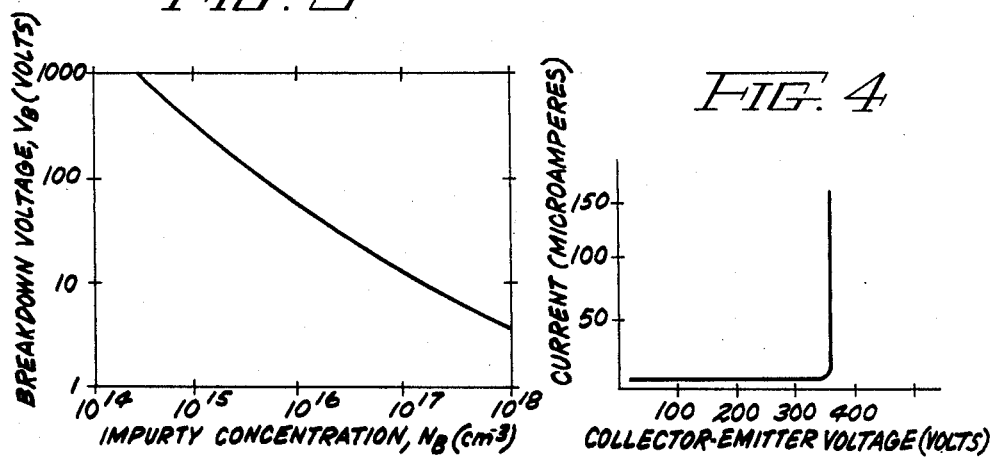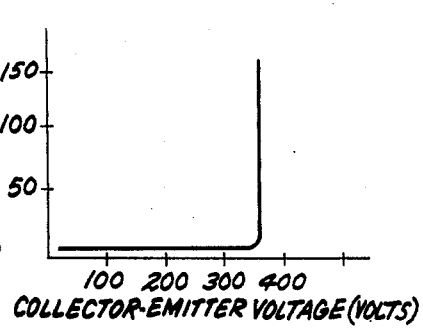

HIGH VOLTAGE INTEGRATED CIRCUITS

This application is a continuation of application Ser. No. 514,752 filed July 18, 1983, now abandoned which is a continuation of application Ser. No. 002,378, filed Jan. 10, 1979, now abandoned, which is a continuation of application Ser. No. 870,217, filed Jan. 17, 1978, now abandoned, which is a continuation of application Ser. No. 703,095, filed July 6, 1976, now abandoned.

The present invention relates to integrated circuits and more particularly to a method of achieving high voltage breakdown characteristics in monolithic power integrated circuits.

In monolithic high voltage integrated circuits, there are two conflicting requirements confronting the designer; namely, the requirement to obtain high avalanche breakdown voltages (i.e., in excess of 250 volt breakdown) for power semiconductor devices with low saturation voltages while providing metallic interconnections which insulatingly overlie the semiconductor surface. The requirements of high voltage breakdown are generally achieved by utilizing high resistivity semiconductor material surrounded by heavily doped sinker regions to minimize the saturation voltage. Unfortunately, when bias voltages are applied to the metallic interconnections insulatingly overlying the surface of the semiconductor substrate, undesirable electric fields are created. Specifically, the intensity of these electric fields rises sharply at the insulator-semiconductor interface where the interconnection crosses over a sinker region, frequently causing premature avalanche breakdown in the semiconductor material.

Inversions and other surface problems resulting from interconnection patterns are common in the semiconductor industry. Attempts to solve these problems have involved the use of thick insulating materials placed on the surface of the semiconductor and under the metal interconnection. Also, dielectric isolation techniques involving the use of an insulating layer around and under the entire semiconductor device have also been employed to terminate an inversion or undesirable depletion region. While these techniques have helped to alleviate the problem, they have not been totally satisfactory because of the increased complexity and costs associated with their implementation.

It is therefore an object of this invention to provide an improved integrated circuit and method of incorporating high voltage power semiconductor devices therein with metal interconnections insulatingly overlying the semiconductor substrate that do not cause premature avalanche breakdown in the substrate.

It is a further object of this invention to minimize electric field effects in a semiconductor substrate resulting from voltages applied to metallic interconnections insulatingly overlying high conductivity regions of an integrated circuit substrate.

Briefly, in accordance with one embodiment of our invention, premature avalanche breakdown is minimized by selectively providing discontinuities in the high conductivity regions underlying the metallic interconnections so that metallic interconnections do not cross over semiconductor regions of high conductivity. In the fabrication of a high voltage power transistor in an integrated circuit, for example, an epitaxial layer of relatively high resistivity is formed on a semiconductor substrate. Isolation regions are formed which extend through the epitaxial layer and separate it into a plurality of electrically isolated device regions. The high voltage power transistor, formed in the device region by conventional diffusion techniques, is then interconnected with other active semiconductor devices formed in the integrated circuit by metallic interconnections insulatingly overlying the surface of the semiconductor wafer. In accordance with the present invention, the usual high conductivity sinker regions which are used to reduce saturation voltage drops in the semiconductor substrate are selectively provided with discontinuities in the regions underlying the metallic interconnections. These selective discontinuities prevent premature avalanche breakdown from occurring in the semiconductor substrate.

The novel features believed characteristic of this invention are set forth in the appended claims. The invention itself, together with other objects and advantages thereof, may be best understood by reference to the following detailed description taken in conjunction with the accompanying drawings in which:

FIG. 1 is a plan view of a high voltage power transistor constructed in accordance with an embodiment of the present invention;

FIG. 2 is a sectional view of FIG. 1 taken along the lines 2—2;

FIG. 3 is a log-log plot of avalanche breakdown voltages as a function of semiconductor impurity concentration; and FIG. 4 illustrates the voltage-current characteristics of a reverse biased P-N (base-collector) junction of a typical high voltage power transistor constructed in accordance with the present invention.

Figure 1A:
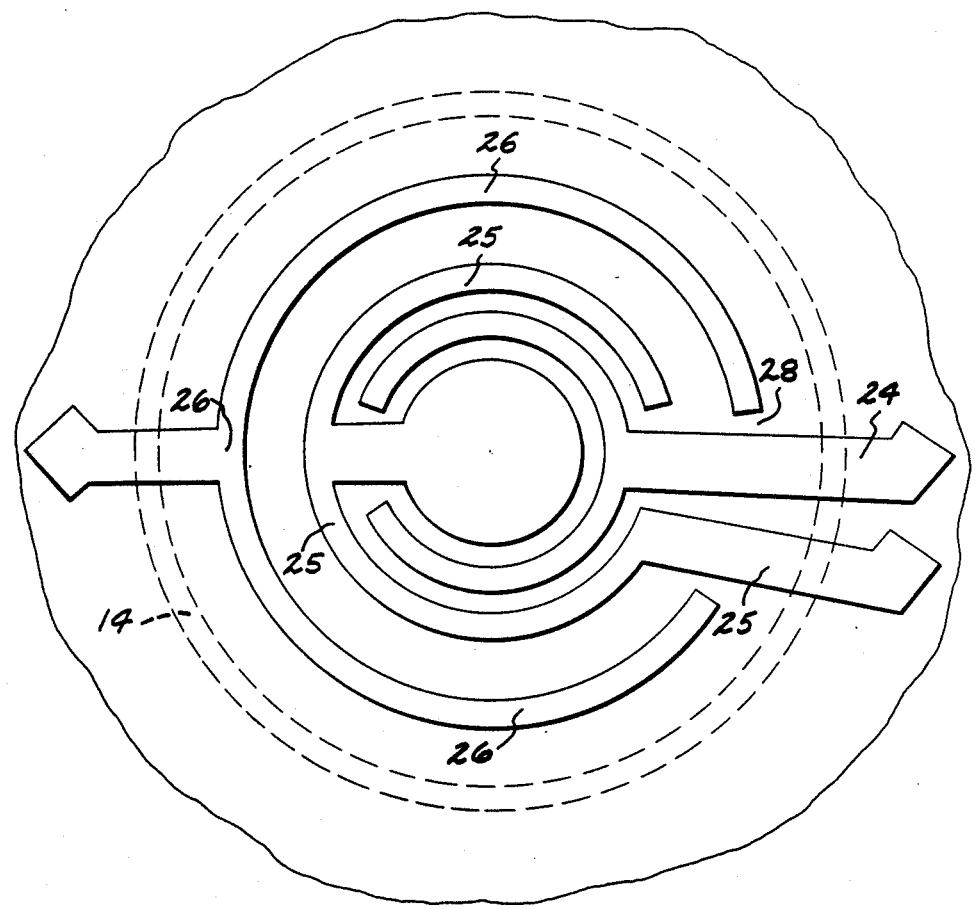
FIG. 1A is a plan view of a high voltage power transistor constructed in accordance with another embodiment of the present invention.

The invention in one embodiment is illustrated in FIGS. 1 and 2 of the drawings in which FIG. 1 is a plan view and FIG. 2 is a partial sectional view of a monolithic integrated circuit structure 10 including a semiconductor substrate 11 of a first type conductivity, such as $P^-$-type conductivity, with an epitaxial layer 12 of a second type conductivity, such as $N^-$-type conductivity, thereover. The epitaxial layer 12 includes a device region 13 electrically isolated from other device regions by a $P^+$-type region 14 extending from the surface 15 of the epitaxial layer 12 to the substrate region 11.

When the integrated circuit is designed to include high voltage power semiconductor devices (i.e., devices capable of handling voltages in excess of 250 volts and power dissipation capabilities in excess of 10 watts), the substrate 11 is selected to have a relatively high resistivity, on the order of 10 to 15 ohm-cm. The $P^+$-type isolation regions 14, on the other hand, are of relatively low resistivity, on the order of 1 ohm-cm or less.

Within the device region 13 enclosed by the isolation region 14 is a high voltage high power bipolar transistor 16 including an emitter region 17, base region 18 and collector region 19. FIG. 2 also illustrates a buried layer 21 of $N^+$-type conductivity substantially at the interface between the substrate 11 and the epitaxial layer 12. A narrow collector contact region 22 (or sinker region) of $N^+$-type conductivity (and relatively low resistivity) extends from the surface 15 of the epitaxial layer 12 to the buried layer 21. Conventional metallization and passivation techniques are employed to make electrical contact to the base, emitter and collector regions of the transistor 16. FIG. 2 illustrates the electrical contact to these regions by electrode members 24, 25 and 26 which are insulated from the semiconductor surface 15 by an insulating layer 27, such as silicon dioxide. FIG. 1 illustrates more clearly the physical arrangement of the base, emitter and collector electrodes 24, 25 and 26, respectively.

FIG. 1 also illustrates the unique feature of our invention which avoids premature avalanche breakdown in the semiconductor device upon application of bias voltages to the electrode members. More specifically, FIG. 1 illustrates the collector electrode 26 and the underlying collector contact region 22 as substantially enclosing the base region 18 but for a discontinuity therein, generally designated by the numeral 28, underlying the base electrode 24. The absence of a high conductivity collector contact region underlying the base increases the width of the space charge region underlying the base electrode 24 and hence increases the voltage required on the base electrode to produce avalanche breakdown. More specifically, the portion of the base electrode 24 insulatingly overlying the discontinuity 28 in the collector contact region 22 is analogous to the metal-insulator-semiconductor (MIS) structure. Accordingly, the relation between the magnitude of the voltage applied to electrode 24 which is necessary to cause avalanche breakdown is obtained from Poisson's equation. However, as described by S. M. Sze in *Physics of Semiconductor Devices* (1969), the breakdown voltage in MIS structures is substantially identical to that for onesided abrupt P-N junctions and is approximated by the following equation:

$$V_B \approx \frac{E_m W}{2}$$

Where
$V_B$ is the avalanche breakdown voltage,
$E_m$ is maximum electric field and
W is the width of the depletion region formed by the electric field.

The foregoing expression can also be approximated by the following equation:

$$V_B \approx 60 \left(\frac{E_g}{1.1}\right)^{3/2} \left(\frac{N_B}{10^{16}}\right)^{-3/4} \text{ volts}$$

where
$E_g$ is the bandgap in eV and
$N_B$ is the background doping in $cm^{-3}$.

FIG. 3 is a log-log plot of the variation in breakdown voltage $V_B$ as a function of impurity concentration. From the curve illustrated in FIG. 3, it is apparent that high breakdown voltages are achieved in semiconductors with low impurity concentrations (high resistivity). Accordingly, by arranging the base electrode 24 (and/or emitter electrode 25) to pass over a discontinuity in the collector contact region 22, premature avalanche breakdown is prevented from occurring and hence the transistor exhibits an exceptionally high breakdown voltage.

In the device of FIG. 1A, which is similar to that of FIG. 1 and wherein like numerals indicate like components, the base electrode 24 and emitter electrode 25 both pass over a discontinuity 28 in sinker 22 (shown in FIG. 2), thereby avoiding premature avalanche breakdown and allowing the transistor to exhibit exceptionally high breakdown voltage.

FIG. 4, for example, illustrates the reverse biased base-collector voltage and current characteristics typical of a bipolar transistor constructed in accordance with the present invention. As is apparent from this figure, an avalanche breakdown voltage of approximately 370 volts is achieved. In contrast, a transistor, for example, without the discontinuity in the collector contact region would exhibit an avalanche breakdown voltage of only 250 volts. Accordingly, it can be readily appreciated by those skilled in the art that a substantial improvement in the avalanche breakdown voltage is achieved by the selective location of a discontinuity in the collector contact region.

Similarly, those skilled in the art can readily appreciate that the invention has application to numerous other semiconductor devices where premature avalanche breakdown is caused by metallic interconnections insulatingly overlying a semiconductor surface. Additionally, whereas the invention has been described with reference to a single discontinuity in the collector contact region obviously multiple discontinuities may be utilized if desired at some sacrifice in saturation resistance. Still further, although the invention has been described with reference to an N-P-N type bipolar transistor, the invention is equally applicable to P-N-P type transistors as well as thryistors, field effect transistors, diodes, and other semiconductor devices, particularly those constructed in integrated circuits.

Although the invention has been described with reference to a specific embodiment, it should be obvious to those skilled in the art that various modifications may be made without departing from the true spirit and scope of the invention.

What we claim as new and desire to secure by Letters Patent of the United States is:

1. A monolithic integrated circuit including a semiconductor substrate with an epitaxial layer thereover, said layer having an active semiconductor device formed therein and electrically isolated from other devices in said layer, said active semiconductor device including electrode means insulatingly overlying said layer and conducting a selected region of said active semiconductor device, and a region of higher conductivity than said layer substantially enclosing said selected region except a region of lower conductivity lying substantially directly beneath said electrode means, said electrode means thereby not crossing said higher conductivity region and thereby avoiding premature avalanche breakdown in the semiconductor device of said monolithic integrated circuit upon application of bias voltages to said device via said electrode means.

2. The monolithic integrated circuit of claim 1 wherein said active semiconductor device is a bipolar transistor having base, emitter and collector regions formed in said layer.

3. The monolithic integrated circuit of claim 2 wherein said electrode means contacts the base region of said transistor.

4. The monolithic integrated circuit of claim 3 further comprising a buried layer formed in said substrate, said higher conductivity region contacting said buried layer.

5. The monolithic integrated circuit of claim 4 wherein said higher conductivity region substantially encloses the base region of said bipolar transistor except in the portion of the semiconductor substrate underlying the electrode means.

6. The monolithic integrated circuit of claim 2 wherein said electrode means contacts the base and emitter regions of said transistor.

7. The monolithic integrated circuit of claim 6 further comprising a buried layer formed in said substrate, said higher conductivity region contacting said buried layer.

8. The monolithic integrated circuit of claim 7 wherein said higher conductivity region substantially encloses the base region of said bipolar transistor except in the portion of the semiconductor substrate underlying the electrode means.

9. The monolithic integrated circuit of claim 2 wherein said electrode means contacts the emitter region of said transistor.

10. The monolithic integrated circuit of claim 9 further comprising a buried layer formed in said substrate, said higher conductivity region contacting said buried layer.

* * * * *